US011550076B2

United States Patent
Edwards et al.

(10) Patent No.: US 11,550,076 B2
(45) Date of Patent: Jan. 10, 2023

(54) ADAPTIVE REAL-TIME NUCLEAR MAGNETIC RESONANCE LOGGING FOR SUBSURFACE OPERATIONS

(71) Applicants: Carl Edwards, Katy, TX (US); Marc Ramirez, Missouri City, TX (US); Otto Fanini, Houston, TX (US); Stanislav Forgang, Houston, TX (US); Ryan Rocheleau, Houston, TX (US)

(72) Inventors: Carl Edwards, Katy, TX (US); Marc Ramirez, Missouri City, TX (US); Otto Fanini, Houston, TX (US); Stanislav Forgang, Houston, TX (US); Ryan Rocheleau, Houston, TX (US)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 0 days.

(21) Appl. No.: 17/155,497

(22) Filed: Jan. 22, 2021

(65) Prior Publication Data

US 2022/0236443 A1 Jul. 28, 2022

(51) Int. Cl.
| | |
|---|---|
| *G01V 3/32* | (2006.01) |
| *G01R 33/50* | (2006.01) |
| *G01N 24/08* | (2006.01) |
| *G01V 3/38* | (2006.01) |

(52) U.S. Cl.
CPC ............. *G01V 3/32* (2013.01); *G01N 24/081* (2013.01); *G01R 33/50* (2013.01); *G01V 3/38* (2013.01)

(58) Field of Classification Search
CPC . G01R 33/50; G01V 3/32; G01V 3/38; G01N 24/081
See application file for complete search history.

(56) References Cited

U.S. PATENT DOCUMENTS

| | | | |
|---|---|---|---|
| 6,624,629 | B1 | 9/2003 | Speier et al. |
| 2004/0104048 | A1 | 6/2004 | Woodburn et al. |
| 2015/0301146 | A1 | 10/2015 | Griswold et al. |
| 2016/0033671 | A1 | 2/2016 | Chen |
| 2018/0017700 | A1* | 1/2018 | Shin ................... E21B 49/08 |
| 2018/0372907 | A1 | 12/2018 | Dykstra et al. |
| 2020/0174153 | A1* | 6/2020 | Song ..................... G01V 3/32 |
| 2020/0333501 | A1* | 10/2020 | Miller ..................... G01V 3/32 |

OTHER PUBLICATIONS

Cosgrove, T. (1976). "Single scan spin-echo measurements of T1 and T2." Journal of Magnetic Resonance (1969) 21(3): 469-472, https://doi.org/10.1016/0022-2364(76)90051-2.

(Continued)

*Primary Examiner* — Gregory H Curran
(74) *Attorney, Agent, or Firm* — Cantor Colburn LLP (57) ABSTRACT

Methods and logging systems for performing nuclear magnetic resonance (NMR) logging in downhole operations are described. The methods include performing a scout logging acquisition operation using an NMR logging tool to determine NMR logging parameters of a formation interval, setting an NMR logging acquisition mode based on the NMR logging parameters from the scout logging acquisition operation, and performing an NMR data logging operation to determine properties of the formation interval based on the set NMR logging acquisition mode.

20 Claims, 7 Drawing Sheets

(56) References Cited

OTHER PUBLICATIONS

Demco, D. E., V. Simplaceanu and I. Ursu (1974). "Single-scan method for measuring spin-lattice relaxation times." Journal of Magnetic Resonance (1969) 15(1): 166-169, https://doi.org/10.1016/0022-2364(74)90187-5.
Notification of Transmittal of the International Search Report and the Written Opinion of the International Searching Authority, or the Declaration; PCT/US2022-012116; dated Apr. 22, 2022: 8 pages.

* cited by examiner

Acquisition Parameters

| Echo Train(s) | TW (msec) | TE (msec) | NECHO | NREPT | FREQ (kHz) | DOI (in) |
|---|---|---|---|---|---|---|
| 1A | 6100+ | 0.6 | 833 | 1 | 975 | 2.2 |
| 1C | 20 | 0.3 | 33 | 36 | | |
| 2D | 7400+ | 0.6 | 50 | 1 | 630 | 3.3 |
| 2E | 100 | 0.6 | 50 | 1 | | |
| 3D | 6450+ | 0.6 | 50 | 1 | 775 | 2.8 |
| 3E | 100 | 0.6 | 50 | 1 | | |
| 3C | 20 | 0.3 | 33 | 32 | | |
| 4A | 6100+ | 0.6 | 833 | 1 | 870 | 2.5 |
| 4C | 20 | 0.3 | 33 | 36 | | |
| 5D | 7400+ | 0.6 | 50 | 1 | 565 | 3.7 |
| 5E | 100 | 0.6 | 50 | 1 | | |
| 6D | 6450+ | 0.6 | 50 | 1 | 700 | 3.0 |
| 6E | 100 | 0.6 | 50 | 1 | | |
| 6C | 20 | 0.3 | 33 | 32 | | |

ADAPTIVE REAL-TIME NUCLEAR MAGNETIC RESONANCE LOGGING FOR SUBSURFACE OPERATIONS

BACKGROUND

1. Field of the Invention

The present invention generally relates to downhole operations and systems with logging systems employing nuclear magnetic resonance techniques.

2. Description of the Related Art

Boreholes are drilled deep into the earth for many applications such as carbon dioxide sequestration, hydrogen storage, geothermal production, and hydrocarbon exploration and production. In all of the applications, the boreholes are drilled such that they pass through or allow access to a material (e.g., a gas or fluid) contained in a formation (e.g., a compartment) located below the earth's surface. Different types of tools and instruments may be disposed in the boreholes to perform various tasks and measurements.

One type of such downhole tool is a nuclear magnetic resonance (NMR) logging tool. An NMR logging tool is used to detect formation properties. Such tools are set or configured at the surface, and then disposed downhole (e.g., on wireline or along a drill string). The configuration at the surface requires a priori information to select NMR logging acquisition parameters, which may be based on information known, estimated, or modeled regarding the formation(s) through which the tool will pass and perform measurements on. NMR logging acquisitions range from being very simple, such as one that is related to bound-water acquisitions that detects only clay-bound water and immobile water. In contrast, some NMR logging acquisitions may be very complex, such as porosity/permeability-plus-light oil that seeks to differentiate light oil from movable water and bound water.

Formations frequently have intervals of different layers of material or composition (e.g., shale layers separating intervals of highly porous sandstone or carbonates). The different intervals may contain gas, water, oil, or combinations thereof. When an NMR logging tool is configured at the surface, such tool may be optimized for performing optimally within the shale intervals, but not for the highly porous sandstone intervals. Such a priori optimization may result in reduced accuracy results for, at least, the sections of the formation within the sandstone intervals.

SUMMARY

Disclosed herein are methods for performing nuclear magnetic resonance (NMR) logging in downhole operations. The methods include performing a scout logging acquisition operation using an NMR logging tool to determine NMR logging parameters of a formation interval, setting an NMR logging acquisition mode based on the NMR logging parameters from the scout logging acquisition operation, and performing an NMR data logging operation to determine properties of the formation interval based on the set NMR logging acquisition mode.

Disclosed herein are downhole logging systems. The downhole logging systems include an NMR logging tool configured to perform a scout logging acquisition operation using an NMR logging tool to determine NMR logging parameters of a formation interval, set an NMR logging acquisition mode based on the NMR logging parameters from the scout logging acquisition operation, and perform an NMR data logging operation to determine properties of the formation interval based on the set NMR logging acquisition mode.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings, wherein like elements are numbered alike, in which:

DETAILED DESCRIPTION

Figure 1:
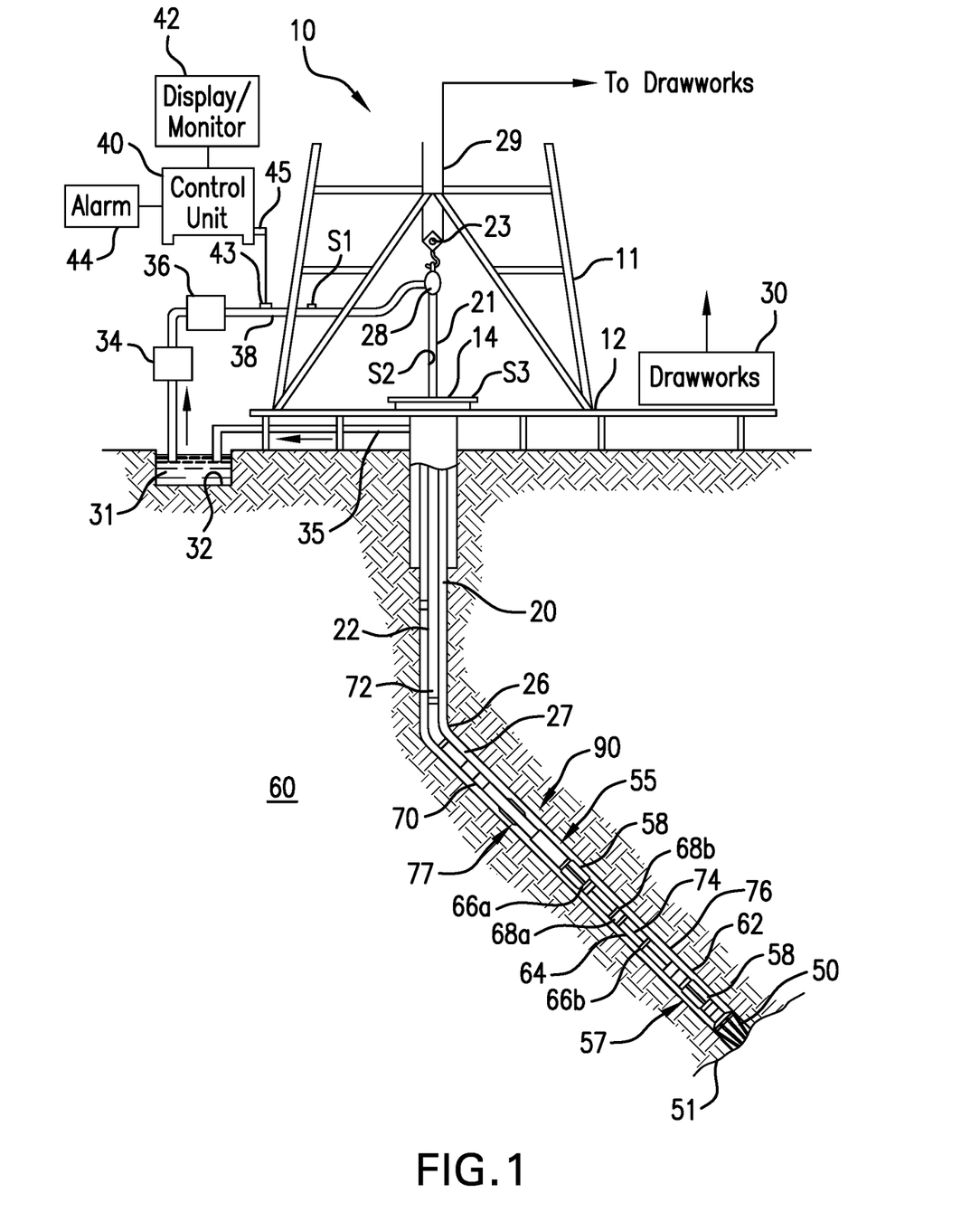
FIG. 1 is an example of a system for performing downhole operations that can employ embodiments of the present disclosure.

FIG. 1 shows a schematic diagram of a system for performing downhole operations. As shown, the system is a drilling system 10 that includes a drill string 20 having a drilling assembly 90, also referred to as a bottomhole assembly (BHA), conveyed in a borehole 26 penetrating an earth formation 60. The drilling system 10 includes a conventional derrick 11 erected on a floor 12 that supports a rotary table 14 that is rotated by a prime mover, such as an electric motor (not shown), at a desired rotational speed. The drill string 20 includes a drilling tubular 22, such as a drill pipe, extending downward from the rotary table 14 into the borehole 26. A disintegration device 50, such as a drill bit attached to the end of the BHA 90, disintegrates the geological formations when it is rotated to drill the borehole 26. The drill string 20 is coupled to surface equipment such as systems for lifting, rotating, and/or pushing, including, but not limited to, a drawworks 30 via a kelly joint 21, swivel 28 and line 29 through a pulley 23. In some embodiments, the surface equipment may include a top drive (not shown). During the drilling operations, the drawworks 30 is operated to control the weight on bit, which affects the rate of penetration. The operation of the drawworks 30 is well known in the art and is thus not described in detail herein.

During drilling operations a suitable drilling fluid 31 (also referred to as the "mud") from a source or mud pit 32 is circulated under pressure through the drill string 20 by a mud pump 34. The drilling fluid 31 passes into the drill string 20 via a desurger 36, fluid line 38 and the kelly joint 21. The drilling fluid 31 is discharged at the borehole bottom 51 through an opening in the disintegration device 50. The drilling fluid 31 circulates uphole through the annular space 27 between the drill string 20 and the borehole 26 and returns to the mud pit 32 via a return line 35. A sensor S1 in the fluid line 38 provides information about the fluid flow rate. A surface torque sensor S2 and a sensor S3 associated with the drill string 20 respectively provide information about the torque and the rotational speed of the drill string. Additional sensors may be configured at the surface (e.g., as part of the drilling system 10 and/or disposed downhole) and can include, without limitation, a gas tomographic sensor configured to monitor gas content and composition of the drilling fluid 31 while circulating the drilling fluid. Some such sensors may be configured with longer response times (minutes) than via detection using BHA embedded sensors and transmission via Electromagnetic Telemetry (seconds). Additionally, one or more sensors associated with line 29 are used to provide the hook load of the drill string 20 and about other desired parameters relating to the drilling of the borehole 26. The system may further include one or more downhole sensors 70 located on the drill string 20 and/or the BHA 90.

In some applications the disintegration device 50 is rotated by only rotating the drill pipe 22. However, in other applications, a drilling motor 55 (for example, a mud motor) disposed in the drilling assembly 90 is used to rotate the disintegration device 50 and/or to superimpose or supplement the rotation of the drill string 20. In either case, the rate of penetration (ROP) of the disintegration device 50 into the earth formation 60 for a given formation and a given drilling assembly largely depends upon the weight on bit and the drill bit rotational speed. In one aspect of the embodiment of FIG. 1, the drilling motor 55 is coupled to the disintegration device 50 via a drive shaft (not shown) disposed in a bearing assembly 57. The drilling motor 55 rotates the disintegration device 50 when the drilling fluid 31 passes through the drilling motor 55 under pressure. The bearing assembly 57 supports the radial and axial forces of the disintegration device 50, the downthrust of the drilling motor and the reactive upward loading from the applied weight on bit. Stabilizers 58 coupled to the bearing assembly 57 and/or other suitable locations act as centralizers for the drilling assembly 90 or portions thereof.

One or more surface control units 40 can be configured to receive signals from the downhole sensors 70 and devices via a transducer 43, such as a pressure transducer, placed in the fluid line 38, as well as from sensors S1, S2, S3 (and other surface sensors), hook load sensors, RPM sensors, torque sensors, downhole sensors, and any other sensors used in the system and processes such signals according to programmed instructions provided to the surface control units 40. The surface control units 40 can be configured to display desired drilling parameters and other information on one or more associated display/monitor 42 for use by an operator at the rig site to control the drilling operations. The surface control units 40 may include a computer, memory for storing data, computer programs, models and algorithms accessible to a processor in the computer, a recorder, such as tape unit, memory unit, etc. for recording data and other peripherals. The surface control units 40 also may include simulation models for use by the computer to processes data according to programmed instructions. The surface control units are configured to responds to user commands entered through a suitable device, such as a keyboard. The surface control units 40 can be configured to activate alarms 44 when certain unsafe or undesirable operating conditions occur.

The drilling assembly 90 also contains other sensors and devices or tools for providing a variety of measurements relating to the formation surrounding the borehole and for drilling the borehole 26 along a desired path. Such devices may include a device for measuring the formation resistivity near and/or in front of the drill bit, a gamma ray device for measuring the formation gamma ray intensity and devices for determining the inclination, azimuth and position of the drill string. A formation resistivity tool 64, made according an embodiment described herein may be coupled at any suitable location, including above a lower kick-off subassembly or steering unit 62, for estimating or determining the resistivity of the formation near or in front of the disintegration device 50 or at other suitable locations. An inclinometer 74 and a gamma ray device 76 may be suitably placed for respectively determining the inclination of the BHA and the formation gamma ray intensity. Any suitable inclinometer and gamma ray device may be utilized. In addition, an azimuth device (not shown), such as a magnetometer or a gyroscopic device, may be utilized to determine the drill string azimuth. Such devices are known in the art and therefore are not described in detail herein. In the above-described exemplary configuration, the drilling motor 55 transfers power to the disintegration device 50 via a shaft that also enables the drilling fluid to pass from the drilling motor 55 to the disintegration device 50. In an alternative embodiment of the drill string 20, the drilling motor 55 may be coupled below the resistivity measuring device 64 or at any other suitable place.

Still referring to FIG. 1, other logging-while-drilling (LWD) devices (generally denoted herein by numeral 77), such as devices for measuring formation porosity, permeability, density, rock properties, fluid properties, etc. may be placed at suitable locations in the drilling assembly 90 for providing information useful for evaluating the subsurface formations along borehole 26. Such devices may include, but are not limited to, temperature measurement tools, pressure measurement tools, borehole diameter measuring tools (e.g., a caliper), acoustic tools, nuclear tools, nuclear magnetic resonance tools and formation testing and sampling tools.

The above-noted devices transmit data to a downhole telemetry system 72, which in turn transmits the received data uphole to the surface control unit 40. The downhole telemetry system 72 also receives signals and data from the surface control unit 40 and transmits such received signals and data to the appropriate downhole devices. In one aspect, a mud pulse telemetry system may be used to communicate data between the downhole sensors 70 and devices and the surface equipment during drilling operations. A transducer 43 placed in the fluid line 38 (e.g., mud supply line) detects the mud pulses responsive to the data transmitted by the downhole telemetry system 72. Transducer 43 generates electrical signals in response to the mud pressure variations and transmits such signals via a conductor 45 to the surface control unit 40.

In other aspects, any other suitable telemetry system may be used for two-way data communication (e.g., downlink and uplink) between the surface and the BHA 90, including but not limited to, an acoustic telemetry system, an electromagnetic telemetry system, an optical telemetry system, a wired pipe telemetry system which may utilize wireless couplers or repeaters in the drill string or the borehole. The wired pipe telemetry system may be made up by joining drill pipe sections, wherein each pipe section includes a data communication link, such as a wire, that runs along the pipe. The data connection between the pipe sections may be made by any suitable method, including but not limited to, hard electrical or optical connections, induction, capacitive, resonant coupling, such as electromagnetic resonant coupling, or directional coupling methods. In case a coiled-tubing is used as the drill pipe 22, the data communication link may be run along a side of the coiled-tubing.

The drilling system described thus far relates to those drilling systems that utilize a drill pipe to convey the drilling assembly 90 into the borehole 26, wherein the weight on bit is controlled from the surface, typically by controlling the operation of the drawworks. However, a large number of the current drilling systems, especially for drilling highly deviated and horizontal boreholes, utilize coiled-tubing for conveying the drilling assembly downhole. In such application a thruster is sometimes deployed in the drill string to provide the desired force on the drill bit. Also, when coiled-tubing is utilized, the tubing is not rotated by a rotary table but instead it is injected into the borehole by a suitable injector while the downhole motor, such as drilling motor 55, rotates the disintegration device 50. For offshore drilling, an offshore rig or a vessel is used to support the drilling equipment, including the drill string.

Still referring to FIG. 1, a resistivity tool 64 may be provided that includes, for example, a plurality of antennas including, for example, transmitters 66a or 66b and/or receivers 68a or 68b. Resistivity can be one formation property that is of interest in making drilling decisions. Those of skill in the art will appreciate that other formation property tools can be employed with or in place of the resistivity tool 64.

Although FIG. 1 is shown and described with respect to a drilling operation, those of skill in the art will appreciate that similar configurations, albeit with different components, can be used for performing different downhole operations. For example, wireline, wired pipe, liner drilling, reaming, coiled tubing, and/or other configurations can be used as known in the art. Further, production configurations can be employed for extracting and/or injecting materials from/into earth formations. Thus, the present disclosure is not to be limited to drilling operations but can be employed for any appropriate or desired downhole operation(s).

One tool that may be used during drilling operations (e.g., logging-while-drilling) or arranged and deployed using wireline tools is a nuclear magnetic resonance (NMR) logging tool.

An NMR logging tool is used to detect formation properties, and typically used to detect fluid or liquid volumes of a formation. Such tools are typically set or configured at the surface, and then disposed downhole (e.g., on wireline or along a drill string). The configuration at the surface requires a priori information to select NMR logging acquisition parameters, which may be based on information known, estimated, or modeled regarding the formation(s) through which the tool will pass and perform measurements on. NMR logging acquisitions range from being very simple, such as one that is related to bound-water NMR logging acquisitions that are configured to detect only clay-bound water and immobile water. In contrast, some NMR logging acquisitions may be very complex, such as porosity/permeability-plus-light oil NMR logging acquisitions that are configured to differentiate light oil from movable water and bound water. Formations frequently have intervals of different layers of material or composition (e.g., shale layers separating intervals of highly porous sandstone or carbonates). The different intervals may contain gas, water, oil, or combinations thereof. When an NMR logging tool is configured at the surface, such tool may be optimized for performing optimally within the shale intervals, but not for the highly porous sandstone intervals. Such a priori optimization may result in reduced accuracy for, at least, the sections of the formation within the sandstone intervals. Additional logging passes may be required to detect formation and fluid properties (e.g., within sandstone intervals) that were not captured on a first logging run. This would need additional logging and rig time and increases overall cost and risk for operators. These additional costs, in some cases, may sway operators to avoid using NMR technology altogether, limiting the operators' understanding of a reservoir.

An NMR logging tool is used to measure an induced magnetic moment of hydrogen nuclei contained within a fluid-filled pore space (e.g., sensitive volume) of porous media (e.g., reservoir rocks, formation interval, etc.). Unlike other logging measurements (e.g., acoustic, density, neutron, and resistivity) which respond to both the rock matrix and fluid properties and are strongly dependent on mineralogy, NMR-logging measurements respond to the presence of hydrogen protons. Because these protons primarily occur in pore fluids, NMR effectively responds to the volume, composition, viscosity, and distribution of fluids within the intervals (e.g., water, oil, gas, etc.). NMR logs provide information about the quantities and properties of fluids present in an interval and the sizes of the pores containing the fluids. From this information, it is possible to infer or estimate the volume (porosity) and distribution (permeability) of the rock pore space, rock composition, type and quantity of fluid hydrocarbons, and hydrocarbon producibility.

An NMR pulse sequence is a series of one or more radio-frequency (RF) magnetic field pulses transmitted by an NMR logging tool and applied to a formation (e.g., sensitive volumes, such as fluids) in the presence of a static magnetic field B0 produced by a static magnetic field assembly also positioned in the tool. Conventionally, this assembly has been built with strong high temperature magnet materials, such as from samarium-cobalt (SmCo), for example. Alternative methods to create this assembly, such as high current solenoids, exist, but these may be limited by high power requirements to be exposed by the tool operations. The purpose of the static magnetic field B0 is to create an initial nuclear magnetization in the formation by aligning spin vectors of individual nuclei along the static magnetic field and produce a resonant condition for the nuclear spins of interest (usually protons). Interspersed between the RF pulses are a series of measurement RF signals emitted by the sensitive volume in response to the NMR pulse sequence. The measurement RF pulses may be of different durations, phases, frequency, amplitude, and shape. At the NMR logging tool, the measurement RF signals may be acquired with different phases and durations by a detector, as will be appreciated by those of skill in the art. During operation, the NMR pulse sequence may be repeated with a repetition time. It will be appreciated that a pulse sequence is a time-series of RF pulses and data measurement intervals with constant parameters. However, it will be appreciated that the relative phase of the pulses may vary.

Figure 2:
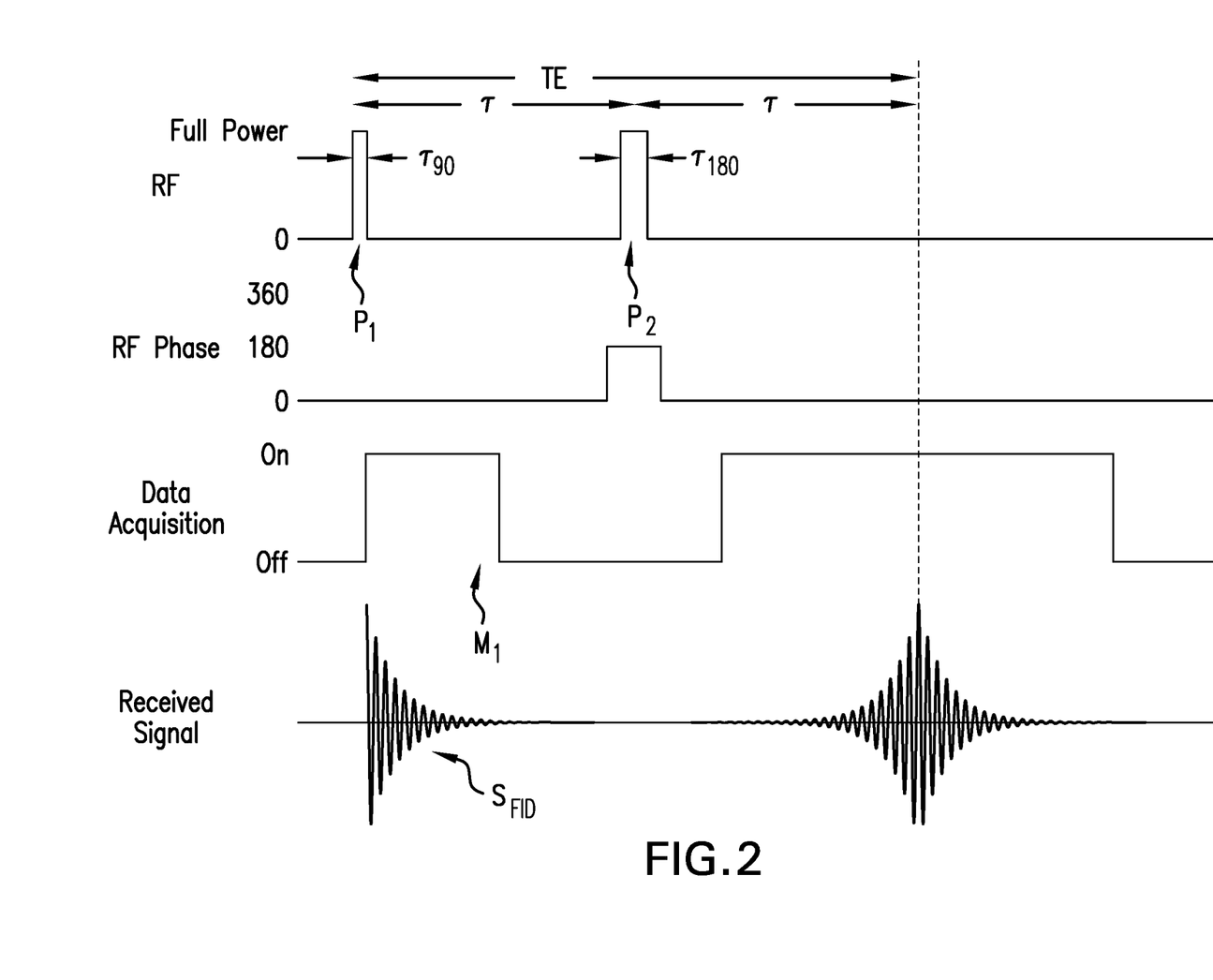
FIG. 2 illustrates an example of an NMR pulse sequence operation that may be employed in embodiments of the present disclosure.

A simple example of an NMR pulse sequence is shown in FIG. 2. The pulse sequence begins with an initial pulse $P_1$ of known duration and amplitude such that it rotates a nuclear magnetization vector of a formation by 90° with respect to the static magnetic field B0. The initial pulse $P_1$ may be followed by a first measurement period $M_1$ of the NMR signal following the initial pulse $P_1$ whose phase and duration is selected to optimize the data acquisition. The signal $S_{FID}$ following the initial pulse $P_1$, or generally any pulse, is commonly called a free induction decay or FID. The time it takes the FID to decay is called or referred to as $T_{2*}$. After a time $\tau$, a second pulse $P_2$ that has an amplitude and duration sufficient to rotate the nuclear magnetization by 180° is transmitted. An optional change of phase for the second pulse $P_2$ is shown. A second measurement period $M_2$ follows the transmission of the second pulse $P_2$. The measurement of the NMR signal received back at the source location (or at the NMR logging tool) may occur near the occurrence of what is commonly called a spin echo at a time TE (TE≈2$\tau$) and this process usually repeats every TE to sample (i.e., measure at discrete time points) the decaying NMR signal. The entire NMR pulse sequence may be repeated after a time from the last pulse $P_2$ (illustratively shown in the example of FIG. 3, below). The phase of transmitted pulses and data acquisition may be varied during these repeated pulse sequences.

Figure 3:
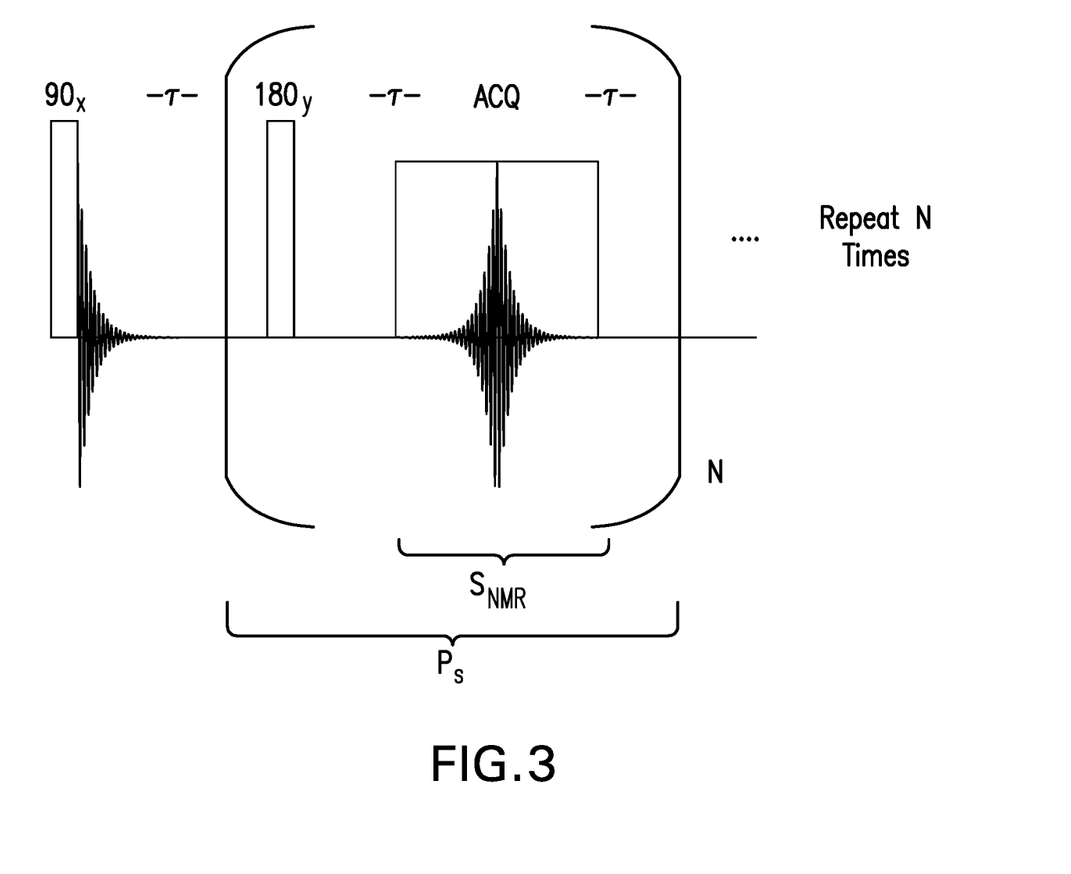
FIG. 3 illustrates a pulse sequence used in NMR well logging in embodiments of the present disclosure.

One pulse sequence commonly used in NMR well logging is shown in FIG. 3. The NMR pulse sequence illustratively shown in FIG. 3 is called the Carr-Purcell-Meiboom-Gill or CPMG pulse sequence. The CPMGNMR pulse sequence is employed to collect measurements of N spin echoes and is commonly used to estimate the transverse relaxation ($T_2$) properties in a sensitive volume (e.g., fluid reservoirs or content within a formation interval). The spacing of the 180° pulses may be varied during repeated sequences. If there is a substantial gradient of the static magnetic field B0 applied to the sensitive volume then the CPMG NMR pulse sequence can be used to estimate the diffusion properties of the fluids in the sensitive volume by systematically varying TE (shown in FIG. 2).

In FIG. 3, an RF excitation or NMR pulse sequence $P_s$ and the NMR signal SNMR at 2$\tau$=TE are shown. The figure illustrates FR pulses as dddxx. The digits, "ddd," indicate the rotation angle of the pulse and the subscript "xx" indicates the phase of the pulse. Further, "x" indicates the phase is along the x-axis of the rotating frame and is commonly 0°. Additionally, "y" indicates the phase along the y-axis in the rotating frame or 90°. In FIG. 3, "ACQ" indicates the center of data acquisition and the box indicates the acquisition window. In FIG. 3, "C" indicates time periods between events. The brackets with the subscript "N" indicates that part of the pulse sequence is repeated N times. The first pulse is normally called the excitation pulse and the subsequent pulses are generally known as refocusing pulses. There is a spin echo centered between the blocks. Thus, the sequence is configured to acquire N spin-echoes that decay in amplitude with time. The pulse sequence can be repeated with a repetition time TR. Those of skill in the art will recognize that the excitation pulses and refocusing pulses may vary in phase and rotation angle.

The pulse-sequence example described above in FIG. 3 may generally be used to estimate the transverse relaxation properties of fluids in a formation or formation interval. The above is merely an example, and it will be appreciated by those of skill in the art that there are other pulse sequences that may be used to estimate spin-lattice relaxation properties of a target formation and/or diffusion properties of the target formation.

NMR logging acquisition, during downhole operations, is a collection of pulse sequences applied to one or more sensitive volumes within a formation or formation interval. NMR logging acquisitions are intended to be the optimal methods for estimating one or more NMR properties of the formation. Typically, the pulse sequences are comprised of a number of CPMG pulse sequences (FIG. 3) with different parameters.

Figure 4:
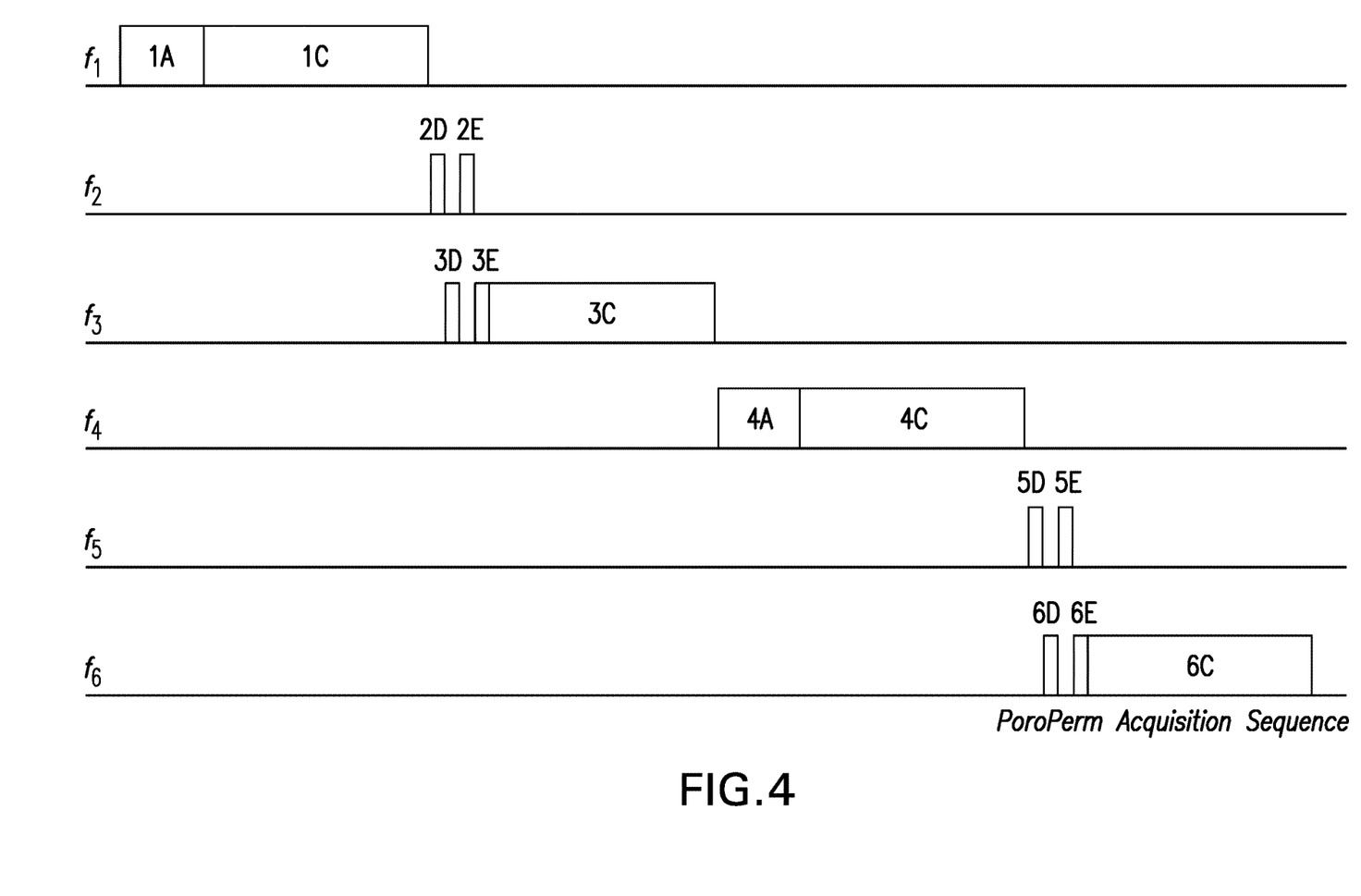
FIG. 4 is an example NMR logging acquisition operation in accordance with an embodiment of the present disclosure.
Figure 5:
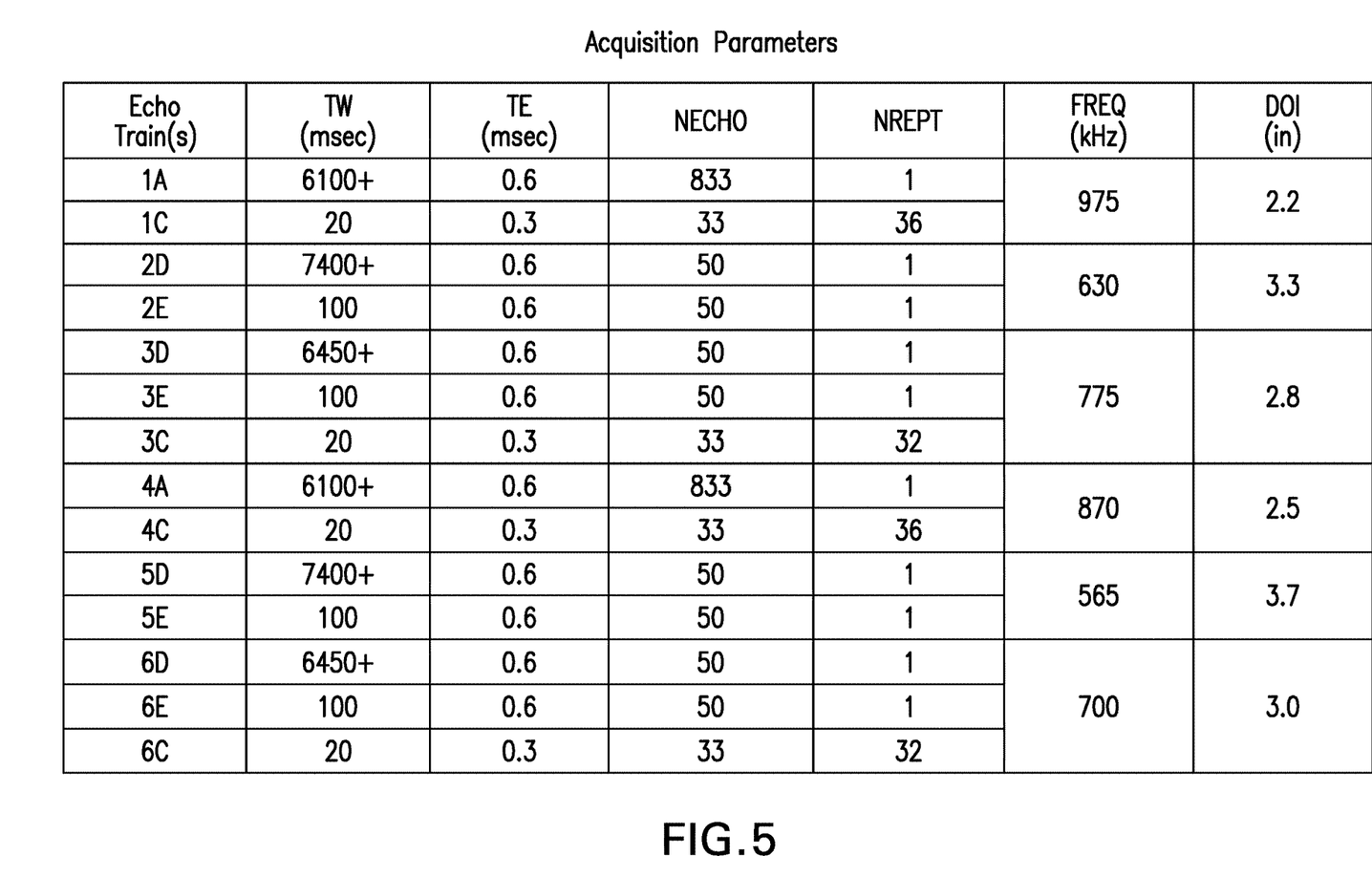
FIG. 5 is a table illustrating an example set of NMR parameters for pulse sequences in accordance with an embodiment of the present disclosure.

Referring to FIG. 4, an example NMR logging acquisition operation is shown. The illustrated operation is configured to optimize the estimation of formation porosity and permeability. The horizontal axis is time and the vertical axis is frequency where $f_i$ is a different fixed frequency ($f_1$, $f_2$, $f_3$, $f_4$, $f_5$, $f_6$). At each fixed frequency, a respective pulse sequence or echo train nnAA, where nn is an integer and AA is a letter, is employed. Each pulse sequence nnAA represents a different pulse sequence with different NMR parameters that are selected to measure a different range of formation fluid properties. Each one of the pulse sequences nnAA is a CPMG sequence in this example. The NMR parameters for each pulse sequence nnAA are shown in FIG. 5. In FIG. 5, echo train refers to the respective pulse sequences nnAA, TW is the wait time, TE is the echo spacing, NECHO is the number of echoes, NREPT is the number of repetitions, FREQ is the frequency, and DOI is the depth of investigation. In some examples, all of the NMR parameters are fixed except for the wait time, TW, or repetition time, although in other configurations other parameters may be fixed in addition to the wait time TW. It will be appreciated that other NMR logging acquisitions may be employed without departing from the scope of the present disclosure.

As noted, data acquisition for wireline and logging-while-drilling (LWD) NMR logging acquisitions are optimized by using a priori information. Once the instrument is in the hole, the logging acquisition mode is set or fixed. For example, such logging acquisition mode may include optimization regarding a wait time (TW) between pulse sequences of the NMR logging tool, which may be set by a logging engineer. The optimization may be a two-step process to ensure a desired operation of the NMR logging tool and ensure proper data collection and logging. A first optimization is made to optimize the logging acquisition mode according to objectives of the NMR logging tool deployment. A second optimization assures that the NMR signal of the formation is fully acquired by the NMR logging tool during operation. For example, in the second optimization, the wait time (TW) between pulse sequences of the NMR logging tool may be set to three times a maximum estimated or anticipated fluid spin-lattice relaxation time ($T_1$) of fluids within a formation. By setting the wait time (TW) to this relatively large value assures that at least 95% of the NMR signal is acquired by the NMR logging tool during operation. After such optimization are made, the logging acquisition mode is not changed.

However, earth formations are not uniform, and thus the formation parameters are not fixed over the entire formation or length of a borehole through which an NMR logging tool is run and operated. That is, different intervals through an earth formation can have very different fluid and rock properties. Thus, a logging acquisition mode that is optimized for a specific type of interval (e.g., specific rock layer or composition) in the formation may not be optimized for other types of intervals. The NMR parameters and pulse sequences of a logging acquisition mode are predefined at the surface (pre-deployment) and based on a priori information, models, and/or estimates. Once deployed, the configuration of the NMR logging tool is not changed. Accordingly, as noted, the NMR logging tool may not be optimized for each different formation interval, but may only be optimized (as best estimated) for a single type of interval or interval characteristics. The problem is especially acute for logging-while-drilling services. In these instances, communication with the surface is limited to about 100 bits per second (due to communication limitations). Thus, an operator or logging engineer has limited opportunity to modify the logging acquisition or select a different one after setting the NMR logging tool. Furthermore, the downhole data preprocessing and data compression may need to be modified and thus it is impractical to modify the LWD NMR logging acquisition in real-time using currently NMR logging tool configurations and systems.

To address this, embodiments of the present disclosure are directed to self-calibrating or automated systems to change or update the NMR logging tool based on a current formation interval. To achieve this, the NMR logging tool is configured to perform a scout logging acquisition operation which estimates current formation fluid properties and is used to update the NMR logging tool parameters and logging acquisition mode to thereby provide an accurate and calibrated tool that is optimized or best-fit to the current formation interval.

Embodiments of the present disclosure are directed to adaptive, real-time NMR logging in which the logging acquisition mode is adjusted, recalibrated, or otherwise optimized in real-time based on the formation (e.g., properties and characteristics) in which the NMR logging tool is actively operating. In operation, and in accordance with some embodiments of the present disclosure, an NMR logging tool may be initially calibrated at the surface based on anticipated conditions or a first formation interval. In other embodiments, the NMR logging tool may not be programmed/calibrated at the surface at all. When the NMR logging tool is disposed downhole, a scout logging acquisition operation may be performed. Such scout logging acquisition operation may be performed based on one or more triggering criteria. For example, the triggering criteria may be a schedule (e.g., time/duration/time interval, depth/depth interval, etc.), a detection of a change in a formation or interval, a user command, or based on other trigger events and/or data, as will be appreciated by those of skill in the art in view of the teachings herein. The results of the scout logging acquisition operation are used to select and/or update an NMR logging acquisition mode based on current formation conditions, properties, and/or characteristics. Further, such scout logging acquisition operation may be used to select appropriate NMR logging parameters of the NMR logging acquisition mode, including wait time (TW). The updated NMR logging acquisition mode, in some embodiments, may be selected from a preset suite of NMR logging acquisition modes (e.g., a stored data set or look-up table) that is selected based on formation properties. Alternatively, or in combination therewith, an active adjusting or optimizing of acquisition parameters and of the NMR logging acquisition mode may be performed in real-time based on current formation interval characteristics.

As used herein, and in accordance with embodiments of the present disclosure, a scout logging acquisition is an NMR logging acquisition that rapidly estimates formation fluid properties. The scout logging acquisition is used to select an NMR logging acquisition and associated logging parameters that optimize the measurement of the NMR fluid parameters of a formation interval by the NMR logging tool. The parameters, wait time, etc. (collectively NMR logging parameters) of the NMR logging tool may be set based on the scout logging acquisition operation. The NMR logging tool can be configured to automatically select the NMR logging parameters from a look-up table or may set such NMR logging parameters based directly on the scout logging acquisition and actively adjust such parameters based on collected data, which can be based on the scout logging acquisition operation and/or other data collected downhole data (e.g., from other downhole tools and/or logging tools).

The scout logging acquisition operation is configured to determine several NMR parameters which may be used to recalibrate or enable automatically setting an NMR logging tool for a given real-time operation. One such NMR parameter is the wait time between measurements at the same frequency. This is important in order to capture the full NMR signal on subsequences that are intended to be fully polarized. Another such NMR parameter is the number of subsequences with different wait times for estimated $T_1/T_2$ two-dimensional maps. Another NMR parameter is the number of subsequences with different echo times. Different echo times are important to estimate diffusion constants and produce D/T2 two-dimensional maps.

The scout logging acquisition operation of embodiments of the present disclosure is configured to estimate relaxation times of fluid(s) within a formation or formation interval and the amount of fluid present in the formation in order to select an appropriate NMR logging acquisition and set associated relevant parameters. For example, the scout logging acquisition may estimate that detected formation fluid has a long spin-lattice relaxation time, but severely under calls the formation porosity. This would indicate that the formation contains gas in the logging interval and that the selection of a gas logging acquisition is appropriate. Alternatively, the scout logging acquisition operation may estimate the spin-lattice relaxation time of a formation is small and thus a bound-fluid logging acquisition should be selected.

Figure 6:
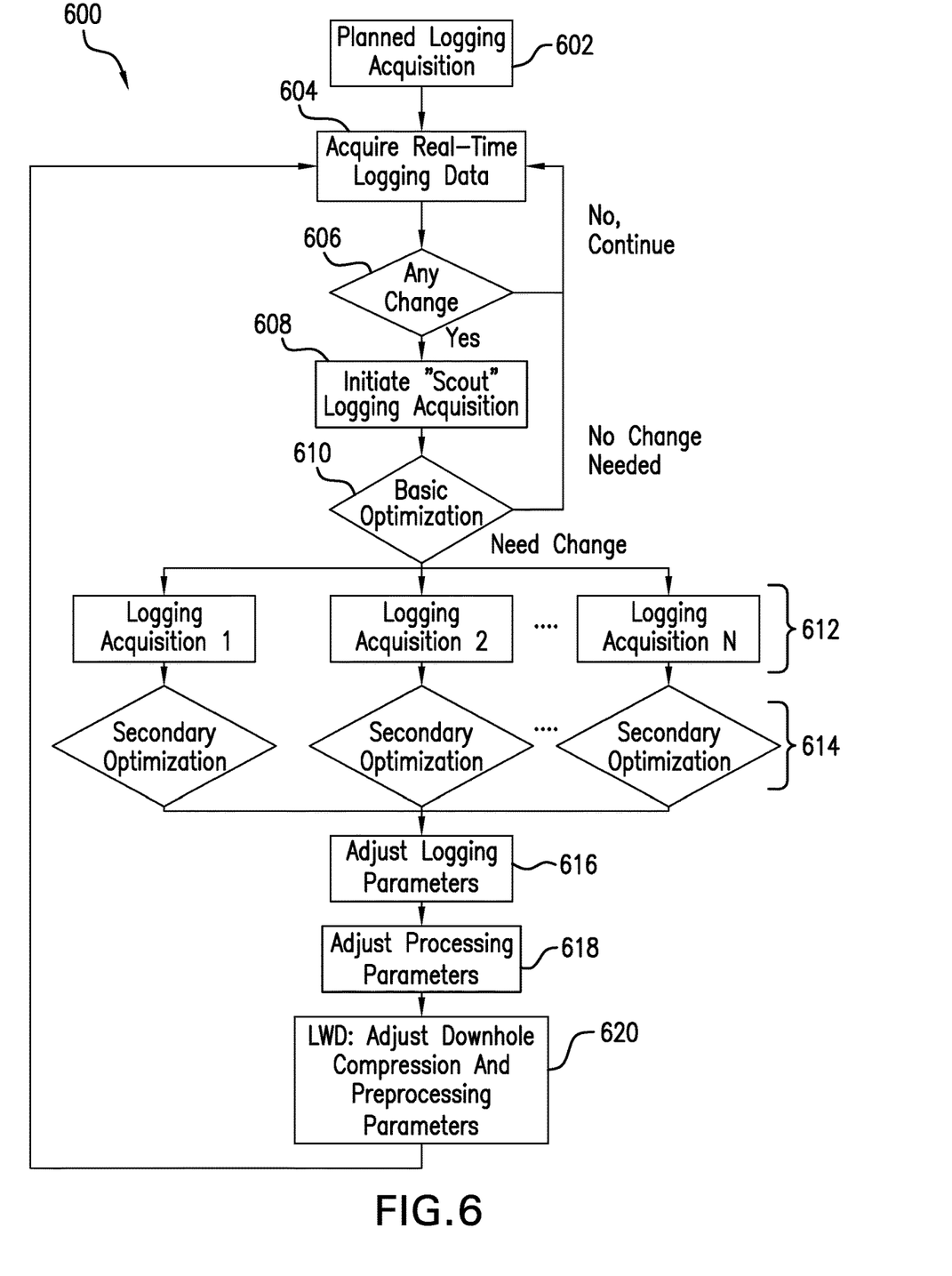
FIG. 6 is a flow process of an NMR logging tool operation in accordance with an embodiment of the present disclosure.

Turning now to FIG. 6, a flow process 600 in accordance with an embodiment of the present disclosure is shown. The flow process 600 may be performed by an NMR logging tool that is disposed within a borehole formed through a formation. The NMR logging tool may be part of a drilling system (e.g., part of a BHA), disposed along a drill string, disposed along wired pipe or coiled tubing, disposed on a wireline system, or otherwise deployed downhole, as will be appreciated by those of skill in the art. The NMR logging tool includes conventional NMR logging components, such as a static field magnet, antenna(s), transmitter(s), receiver(s), and also includes various computer or electronic/electrical components to perform the steps of the flow process 600. For example, the NMR logging tool may include one or more processors, associated memory and/or storage, communication components, etc., as will be appreciated by those of skill in the art.

At block 602, the NMR logging tool is preprogrammed or initially set with a planned logging acquisition. This may be set by an operator at the surface, prior to deployment of the NMR logging tool into the formation. It will be appreciated that this may be an optional step, and in some embodiments, the NMR logging tool may not be preset prior to deployment into a borehole. The preset logging acquisition may be a default state, when data from the scout sequence is corrupted.

At block 604, based on the planned logging acquisition, the NMR logging tool performs NMR logging and acquires real-time logging data. The real-time logging data is NMR data associated with a formation or formation interval proximate and surrounding the NMR logging tool. This may be referred to as an NMR data logging operation, where NMR data is collected and either analyzed, stored, or transmitted to the surface to provide downhole fluid/liquid data information to an operator.

At block 606, the collected NMR data is monitored for changes. Such changes may be detected by looking at the maximum echo amplitude (e.g., correlating with porosity), by analyzing the signal-to-noise ratio (SNR), which can determine the number of CPMG repetitions required to get data of adequate quality, and/or looking at a lower threshold for the echo data relative to the noise floor, indicating that the T2 decay has "ended" and no more echoes are necessary to sample the signal decay. Additionally, the log mean T2 and the total NMR porosity may be monitored. If there is a significant change in either, this will indicate the need to perform a scout logging acquisition operation, at block 608, described below. That is, in one non-limiting example, a processor of the NMR logging tool may actively monitor the collected data that is obtained during the NMR logging performed at block 604 for changes that are indicative of a change in formation or formation interval properties.

If no change is detected, the process is returned to block 604 and no change to the NMR logging acquisition mode or parameters are made. That is, if there is no detected change in the formation, the NMR logging acquisition mode and parameters are maintained at the current (in this case planned/default logging acquisition) mode and parameters, and the logging is continued. This monitoring for changes is performed continuously or periodically and may be based on each data collection or at some other interval (e.g., time interval, depth interval, number of data collections, etc.). The initiation of a change may be triggered by a priori information obtained from tools in the string that have already passed the formation of interest (e.g., have already passed the particular depth at which the NMR measurement is being made).

At block 608, if a change is detected at block 606, the NMR logging tool will initiate a scout logging acquisition operation. The scout logging acquisition of the scout logging acquisition operation is a unique logging signal/sequence and is different from the logging acquisition signals/sequences used to collect NMR data. That is, the scout logging acquisition may be different from data-collection-based NMR logging acquisition parameters and modes. The scout logging acquisition is a unique acquisition that is not customized or tailored to any specific formation properties, but rather is selected to enable detection of NMR logging aspects from a variety of different types of formation/formation intervals. For instance, the acquisition is tailored to detect rough levels of porosity, longest and shortest $T_2$'s, and longest and shortest $T_1$'s, but does not care about the intermediate values.

The scout logging acquisition in accordance with embodiments of the present disclosure can include two types of scout sequences: fast (likelihood) and long (catch all). The initial operation can include the long scout sequence, which is defined by the longest possible acquisition length expected for NMR logging tools. The fast scout sequence may be based on current conditions or the current NMR logging acquisition mode, but have longer acquisition lengths to enable detection of variations and adjustment thereof. The long scout sequence may be defined by the number of echoes (NE) multiplied by echo spacing (TE) (length of long scout sequence=NE*TE). The process will then observe a threshold of signal decay, and if the signal decay goes to zero, the acquisition length will decrease or be made shorter. However, if the signal decay does not decrease and go to zero, the acquisition length can be increased.

One example of a scout logging acquisition is a single-scan $T_1$ pulse sequence. Many methods of single-scan measuring of $T_1$ have been developed, as will be appreciated by those of skill in the art. Some methods do not include a spin echo but rely on using restoring the magnetization to the z-axis (along the static magnetic field B0) prior to the end of the free-induction-decay (FID). One such method involves an inversion pulse and a series of 90° pulses and may be described as expression (1):

$$180_x\text{-}\tau\text{-}(90_x\text{-}\tau'\text{-}90_{-x}\text{-}\tau\text{-})_N \qquad (1)$$

This is a sequence of events or timing expression that is similar to the sequence shown in FIG. 3. In expression (1) and as in FIG. 3, "dddxx" indicates an RF pulse with a rotation angle of "ddd" and a phase of "xx." When "xx" is "-x," the phase is 1800 and 0° when it is "x." The intervals between events are $\tau$ and $\tau'$. The part of the pulse sequence in the parenthesis is repeated N times. In expression (1), the first pulse inverts the magnetization. After a time period, a 900 pulse reads out the amplitude of the magnetization and the second 90° pulse realigns the magnetization along its original alignment. The signal is acquired as an FID immediately following the first 90° pulse and acquires a fraction of the FID. The magnetization relaxes because of $T_1$ processes for another time period, $\tau$. The process is repeated until the magnetization reaches an equilibrium value. The parameters in the pulse sequence must satisfy the following requirements: $\tau' \ll T_2^*$, $T_2$; $\tau \leq T_1$, with $T_2^*$ being the decay time of the FID, and $T_1$ and $T_2$ as defined above. As described, this pulse sequence works well with spectrometer with a uniform static field and with liquids.

Another method may be described as expression (2):

$$180_x°\text{-}\tau\text{-}(90_{-x}°\text{-}\tau'\text{-}180_x°\text{-}\tau'\text{-}90_{-x}°\text{-}\tau\text{-})_N \qquad (2)$$

In expression (2), a refocusing pulse is inserted in the pulse sequence and thus relaxes the condition on $\tau'$. Now, $\tau'$ is not restricted by the decay time of the FID and the limit on $\tau'$ becomes $2\tau' \ll T_2$. However, neither of these pulse sequences will work in well logging applications because the FID occurs within the dead time of the receiver of the instrument and cannot be acquired.

Fortunately, these methods may be modified to be used in well logging applications by inserting one or more additional spin-echo into the sequences. The sequence that uses a single echo is expression (3):

$$180_x°\text{-}\tau\text{-}(90_x°\text{-}\sigma'\text{-}180_y°\text{-}\tau'\text{-}ACQ\text{-}\tau'\text{-}180_y°\text{-}\tau'\text{-}90_{-x}°\text{-}\tau\text{-})_N \qquad (3)$$

Expression (3) replaces the single refocusing pulse in expression (2) with two refocusing pulses separated by $2\tau'$. Instead of acquiring the free-induction-decay after the 90° pulse in the repeated part of the sequence, the FID is refocused by the first 180° and the spin echo is acquired between the two refocusing pulses. The second 180° refocuses the FID into a second spin echo and the $90_{-x}°$ aligns the nuclear magnetization back along the z-axis to further decay by $T_1$ processes. The timing intervals should now satisfy expression (4):

$$4\tau' \ll T_2;\ \tau < T_1. \qquad (4)$$

These restrictions are similar to the first described method shown in expression (2).

The pulse sequence in expression (3) may be modified to eliminate the need for a phase alternate pair of pulse sequences. In this modification, a third echo is inserted into expression (3) and the phase of the inversion pulses is changed. This may be illustrated as expression (5):

$$180_x°\text{-}\tau\text{-}(90_x°\text{-}\tau'\text{-}180_x°\text{-}\tau'\text{-}ACQ\text{-}\tau'\text{-}180_{-x}°\text{-}\tau'\text{-}ACQ\text{-}\tau'\text{-}180_x°\text{-}\tau'\text{-}90_x°\text{-}\tau\text{-})_N. \qquad (5)$$

Echoes are collected between the $180_{\pm x}°$ pulses. The two echoes that are collected are of opposite phase and may be combined to eliminate baseline errors. The timing intervals should now satisfy expression (6):

$$6\tau' \ll T_2; \tau < T_1. \quad (6)$$

The pulse sequences shown in expressions (3) and (5) result in a single data point for n=1 to N. One can instead use a CPMG sequence (top expression) or a PACP sequence (bottom sequence). These are shown in expression (7):

$$180_x°-\tau-(90_x°-\tau'-[180_y°-2\tau']_K-180_y°-\tau'-90_{-x}°-\tau-)_N;$$

$$180_x°-\tau-(90_x°-\tau'-[180_x°-2\tau'-180_{-x}°-2\tau']_K-180_x°-\tau'-90_x°-\tau-)_N. \quad (7)$$

In expression (7), the upper sequence has K+1 echoes but requires the sequence to be repeated with opposite phase. The lower sequence has 2K+1 spin echoes that are combined into K data points. However, this does not require an opposite phase repeat. The limitations for these pulse sequences are provided in expression (8):

$$2(K+1)\tau' \ll T_2; \tau < T_1.$$

$$2(2K+1)\tau' \ll T_2; \tau < T_1. \quad (8)$$

When these pulse sequences are applied to fluids in the formation there is a joint distribution of signal fractions in $T_1$ and $T_2$. Selecting values of K, $\tau'$, and $\tau$, will select the sensitivity of the single-scan methods (expression (7)) to different signal fractions. For example, the methods will be insensitive to the fraction of the signal with $T_1 \leq 5\tau$. Because an estimate of the longest spin-lattice relaxation time may be desired, the pulse sequence values may be set such that:

$$2(K+1)\tau' \ll T_{2,gas}; \tau < \max(T_{1,gas}, \alpha T_{2x}); N\tau \approx 3\max(T_{1,gas}, \alpha T_{2x});$$

$$2(2K+1)\tau' \ll T_{2,gas}; \tau < \max(T_{1,gas}, \alpha T_{2x}); N\tau \approx 3\max(T_{1,gas}, \alpha T_{2x})_1. \quad (9)$$

For expression (9), $T_{2x}$, is found using expression (10), below. The $T_2$ relaxation distribution, $p(T_2)$, is integrated such that the integral is greater than some fraction of the normalized total signal:

$$I = \frac{\int_0^{T_{2x}} p(T_2) dT_2}{\int_0^{\infty} p(T_2) dT}; \quad (10)$$

where $T_{2x}$ is a cut off relaxation time such that $I=I_x$. For the purposes of estimating the maximum longitudinal relaxation time, we select $I_x$ to be about 0.95.

At block 610, a basic optimization is performed. The basic optimization is based on the results of the scout logging acquisition from block 608. This basic optimization may be a change in the parameters of the NMR logging tool for performing real-time logging of data (i.e., block 604). The basic optimization is a step for ensuring that the current parameters and optimization of the NMR logging tool are set to best measure formation properties based on the current formation interval. In some instances, it may be determined that no adjustments are actually needed, and that the current parameters are best suited for the current formation interval. If such situation occurs, the flow process 600 returns to block 604, and logging data is acquired using the NMR logging tool based on the current NMR logging acquisition mode.

However, if a change is needed, the flow process 600 continues to block 612 where the NMR logging acquisition mode may be updated, changed, or calibrated to a specific formation or interval. At block 612, one or more logging acquisitions are selected for the current/specific formation based on the scout logging acquisition performed at block 608. That is, one or more logging acquisitions may be determined to require adjustment to be optimized to the current formation/formation interval. For example, if the formation changes from a high porosity sandstone interval to a shale interval, it may be desirable to change from a logging acquisition optimized to obtain fluid properties to a logging acquisition optimized to obtain clay-bound water and bound water properties. Optionally, at block 614, a secondary optimization for each logging acquisition of block 612 may be performed, also based on the scout logging acquisition of block 608. A secondary optimization may simply change the value of TE, the number of repetitions, or TW, but could still utilize the overall acquisition sequence structure.

Based on the determined updated and optimized parameters, the logging parameters and the NMR logging acquisition mode of the NMR logging tool are updated at block 616. The updated logging parameters may be updated to adjust the logging acquisition(s) to best fit the current formation or formation interval, and specifically to the NMR properties of the formation/formation interval, including, but not limited to the wait time TW, number of repetitions, logging speed, log resolution, etc. of each logging acquisition set a block 612.

After the NMR logging tool is updated or recalibrated, the downhole system that includes the NMR logging tool may also make further optional changes and/or updates. For example, at block 618, processing parameters of the NMR logging tool may also be updated. The processing parameters may include, without limitation, to regularization limits, stacking levels, etc. Furthermore, adjustments may be made to compression and preprocessing parameters of a logging-while-drilling sub and/or system, including, but not limited to providing a processed $T_2$ distribution for every depth interval instead of providing all of the raw or modestly compressed data.

As noted, the flow process 600 may be performed while-drilling or may be otherwise employed (e.g., wireline). Advantageously, even during a drilling operation, when the borehole is first formed or drilled through a formation, an NMR logging tool may be used and continuously and actively updated and optimized to specific formation intervals, as the intervals are drilled through. Such system allows for greatly improved NMR data collection.

An example operation employing the flow process 600 in accordance with an embodiment of the present disclosure will now be described. After the NMR logging tool is deployed into a well bore and logging speed and other logging parameters are set, the a priori logging program acquisition is started. Aside from the logging speed, other parameters such as the NMR wait time, log resolution, etc. are also set. As data is acquired, changes in the well log data sufficient to justify a potential change in the NMR logging acquisition are monitored. For example, the data from an acquisition of a CMPG sequence at time equal to the echo time TE multiplied by the number of echoes (NE) may be compared with a threshold near the noise floor to analyze if signal remains (e.g., is larger than the threshold). If the data is lower than the threshold value, the number of echoes (NE) may be reduced.

The decision process may be made at the surface, in the NMR logging tool, or in another downhole tool operably connected to the NMR logging tool. In the wireline context, the wireline NMR logging tools are amenable to monitoring well log data at the surface and making the decision to run a scout logging acquisition. In the drilling context, monitoring logging data and making scout logging acquisition decisions directly in the NMR logging tool may provide advantages for logging-while-drilling (LWD) operations. Most LWD instruments communicate with the surface via mud pulses. This limits data transfer to somewhere on the order of 100 bytes per second. Additionally, the LWD instruments may be in the well for weeks or months. Thus, it is impractical to modify the LWD NMR logging acquisition mode in real-time based on user input. For any instrument and for LWD instruments in particular, downhole data monitoring and decision making using intra-tool communication is advantageous because it can be performed without operator intervention.

A number of different well deployment measurements and formation evaluation measurements may be used to inform a decision to run a scout logging acquisition operation in accordance with the present disclosure (blocks 606-608). For example, without limitation, such well deployment measurements can include logging speed, well bore dimensions, tool string orientation, tool string acceleration, mud resistivity, formation temperature, and formation pressure. Example formation evaluation measurements can include, without limitation, gamma-ray activity, neutron and gamma-ray absorption, resistivity (both shallow and deep), acoustic absorption and speed, dielectric properties, acoustic and resistivity images, and NMR derived logs. Other information may also be considered, such as, without limitation, the logs of offset wells or seismic data. If the change in the measurements is sufficient (e.g., surpasses a predefined threshold that has been gained from prior logging experience or gathered in the lab), then the scout NMR logging acquisition operation of the present disclosure is performed.

As discussed above, the purpose of the scout logging acquisition is to determine what, if any, change to the logging acquisition is needed (blocks 610-616). If no change is needed, then the NMR logging acquisition continues unchanged. However, if the NMR logging acquisition needs adjustments, a new logging acquisition mode is selected based on the results of the scout logging acquisition along with the basic logging parameters for the new logging acquisition (block 612). A second round of optimization can then be performed (block 614), making changes to the parameters, but not the overall order/structure of the acquisition. At that point, a final adjustment in the logging speed and NMR logging acquisition parameters is made (bock 616). At that point, data collection of NMR logging data may be resumed. Subsequently, the logging acquisition is monitored again for changes that might reflect a need to run the scout sequence again. Because the optimization process (blocks 610-616) may affect data processing, various downhole processing parameters may also be changed if necessary (optional block 618). Furthermore, because of the slow data transfer for LWD tools, downhole data preprocessing and data compression may be changed (option block 620) based on the changes to the NMR logging acquisition mode.

The scout logging acquisition operation of the present disclosure can be used for a variety of purposes and improve formation evaluation processes. For example, the scout logging acquisition may be used to perform broad (wide range) to specific (narrow focus) rock and fluid NMR surveys. Further, an adaptive event sequence may be employed to optimize formation evaluation logs to match actual, downhole fluid and rock characteristics, compositions, and properties. Additionally, the scout logging acquisition can be used with intra-tool string data exchange for adaptive decision making and/or provide for interaction with adaptive surface acquisition systems.

In accordance with embodiments of the present disclosure, and as noted above, the triggering of the scout logging acquisition operation may be user-defined (e.g., transmitted from the surface or preset within the tool), periodic in time, based on depth, based on a change depth or time, based a change in detected values (from the NMR logging tool or other downhole tools), and/or based on a time out of the system, for example. By monitoring NMR data and formation evaluation tools from within the tool string for rock and fluid changes (e.g., bed sequences and/or intervals), a trigger of the scout logging acquisition operation can be made. Further, such scout logging acquisition operation can assist adaptive optimum NMR sequence and acquisition. In some configurations, other downhole logging tools may be used to estimate rock and fluid changes and estimate and/or inform best NMR acquisition parameters.

Figure 7:
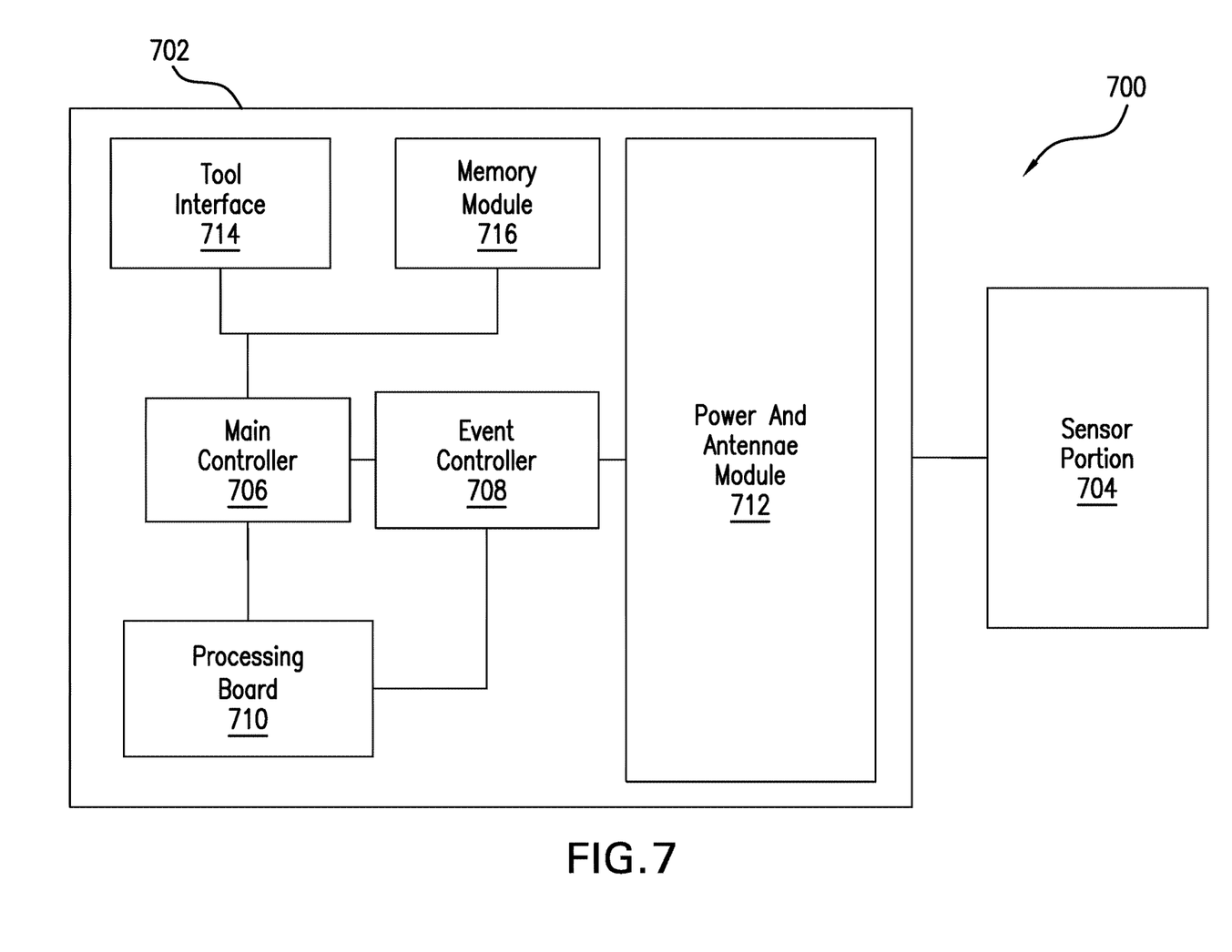
FIG. 7 is a schematic block diagram of an NMR logging tool in accordance with an embodiment of the present disclosure.

Turning now to FIG. 7, a schematic block diagram of an NMR logging tool 700 in accordance with an embodiment of the present disclosure is shown. The NMR logging tool 700 is configured to perform the flow process described above. Further, the NMR logging tool 700 may be arranged as part of a BHA or other portion/tool/system of a drill string, disposed on or as part of a wireline tool, etc., as will be appreciated by those of skill in the art. The NMR logging tool 700 is configured to perform NMR data logging operations (e.g., conventional NMR logging) and the processes described herein.

The NMR logging tool 700 includes an electronics portion 702 and a sensor portion 704. The sensor portion 704 may be configured as a conventional NMR logging tool, having a magnet, coils, antennae and associated components, as will be appreciated by those of skill in the art. The electronics portion 702 includes various components to enable the processing and operation to achieve the automatic calibration of the NMR logging tool 700 in accordance with embodiments of the present disclosure. Although the illustration of FIG. 7 represents the functional aspect of the tool, it is noted that some or all of the electronics could be embedded in the sensor subsection of the tool to provide improvements such as high signal-to-noise ratios, lower echo times, and a reduction in wiring requirements to pass signals through "bulkhead" connectors in tool joints.

The NMR logging tool 700, as shown, includes a main controller 706, and event controller 708, a processing board 710, and a power and antennae module 712. The main controller 706 may include various components including, but not limited to, processors, microprocessors, onboard memory, communication modules, etc., which enable communication with other components of the electronics portion 702. The event controller 708 and the processing board 710 are operably connected to the main controller 706 and configured to enable both NMR logging acquisitions (e.g., data collection) and the scout logging acquisition operation of the present disclosure. These components are configured to control the power and antennae module 712 which in turn causes the sensor module 704 to generate (and receive) RF signals. The main controller 706 may be configured to perform and control both operational NMR interrogation (i.e., generation of NMR logging signals and processing received signals) and also the scout logging acquisition operation.

Part of the scout logging acquisition operation may involve input or data retrieval from a tool interface 714 and/or a memory module 716. The main controller 706 may be programmed to perform the scout logging acquisition operation based on various criteria, including an internal clock and time interval. However, as noted above, certain external triggers may cause the scout logging acquisition operation to be performed. For example, the detection in a change in the NMR logs of the NMR logging tool 700 may trigger the scout logging acquisition operation to be performed. Alternatively, a detection of a change in a formation or interval from external tools (or the surface) may be provided through the tool interface 714. When the scout logging acquisition operation is performed and a change is required to be made to optimize or calibrate the NMR logging tool 700 to a new formation or interval, the main controller 706 may reference the memory module 716 to retrieve data associated with different NMR logging acquisition modes. Based on the retrieved data, the main controller 706 may change or update aspects of the main controller 706 itself, the event controller 708, the power and antennae module 712, and/or the sensor portion 704.

The main controller 706 may be configured to perform a tuning selection to perform the scout logging acquisition operation. To perform the tuning selection of the scout logging acquisition operation, the main controller 706 may be operably coupled to one or more tuning capacitors and cause the injection of test signals into the antennas and test firing using high current. The main controller 706, in combination with the processing board 710, may be configured to tune and quickly select different capacitors or voltage levels of the power and antennae module 712 in order to perform the scout logging acquisition operation and subsequently adjust the configuration of the NMR logging tool 700 to perform recalibrated NMR logging based on the results of the scout logging acquisition operation. As such, the power and antennae module may include a number of high speed switches, analog-to-digital converts, signal generators, memory, etc.

In the logging-while-drilling application and configurations, a power scheme of the power and antennae module 712 and the memory module 716 to store data may be specifically provided to enable this configuration. The stored data in the memory module 716 may include look-up tables, data sets of tool configurations for specific detected formation properties, etc. The power and antennae module 712 and the sensor portion 704 may each be configured to enable on-the-fly changes in the system to allow for many different logging configurations (e.g., based on the specific formation or formation intervals through which the NMR logging tool 700 passes).

The tool interface 714 can provide for data and/or communication to/from other tools along a tool string, drill string, wireline tool, etc. and/or with the surface. The tool interface 714 can include telemetry bandwidth and optimization, surface system automation, sensors or an acquisition sub connected directly to the NMR tool, or a mechanism to monitor the bus of the tool/tool string. External and internal decision making data may be stored (at least temporarily) in the memory module 716 and analyzed using the main controller 706 and/or the processing board 710. The memory module 716 may include volatile and/or non-volatile memory. It will be appreciated that, in some configurations, the memory module 716 may be integrated into one or both of the main controller 706 and/or the event controller 708.

As described above, in some configurations, the NMR logging tool 700 (and the scout logging acquisition operation thereof) may be impacted by data from other tools. Such configuration may require other tools to be operating below the NMR logging tool 700 (i.e., downhole therefrom). In some configurations, the NMR logging tool 700 may be configured to operate both as it traverses a borehole in a downhole direction and in an uphole direction, such as when being removed after drilling is completed. In some such configurations, the down-run could be fast, collecting necessary data, and the up-run could use previously collected data to make decisions and recalibrations.

The memory module 716 may be configured to store logging parameters. In some configurations, the memory module 716 may include a lookup table or decision matrix. In some configurations, data from other tools (through the tool interface 714) or other associated data employed to adjust the NMR logging parameters may be stored on the memory module 716.

Advantageously, in accordance with some embodiments of the present disclosure, improved NMR logging is achieved for downhole operations. The NMR logging of the present disclosure provides for adaptive and self-recalibrating systems that can adjust the logging parameters based on current formation properties, thus enabling fast, efficient, and accurate NMR logging results. Such configurations eliminate the need for a priori knowledge or tool setting prior to deployment, and enable the NMR logging tool to recalibrate as conditions change downhole. This is beneficial both in wireline configurations and drilling configurations. Further, embodiments of the present disclosure rely upon actual data measurements of the current formation, and thus preset errors or assumptions may be eliminated.

While embodiments described herein have been described with reference to specific figures, it will be understood that various changes may be made and equivalents may be substituted for elements thereof without departing from the scope of the present disclosure. In addition, many modifications will be appreciated to adapt a particular instrument, situation, or material to the teachings of the present disclosure without departing from the scope thereof. Therefore, it is intended that the disclosure not be limited to the particular embodiments disclosed, but that the present disclosure will include all embodiments falling within the scope of the appended claims or the following description of possible embodiments.

Embodiment 1: A method for performing nuclear magnetic resonance (NMR) logging in downhole operations, the method comprising: performing a scout logging acquisition operation using an NMR logging tool to determine NMR logging parameters of a formation interval; setting an NMR logging acquisition mode based on the NMR logging parameters from the scout logging acquisition operation; and performing an NMR data logging operation to determine properties of the formation interval based on the set NMR logging acquisition mode.

Embodiment 2: The method of any preceding embodiment, wherein the scout logging acquisition operation comprises an NMR pulse sequence different from an NMR pulse sequence of the NMR data logging operation.

Embodiment 3: The method of any preceding embodiment, wherein the NMR pulse sequence of the scout logging acquisition operation has a longer acquisition than the NMR pulse sequence of the NMR data logging operation.

Embodiment 4: The method of any preceding embodiment, wherein the NMR logging tool is disposed along a drill string.

Embodiment 5: The method of any preceding embodiment, wherein the scout logging acquisition operation is performed while drilling.

Embodiment 6: The method of any preceding embodiment, wherein the NMR logging tool is disposed along a wireline tool string.

Embodiment 7: The method of any preceding embodiment, wherein the NMR logging tool is set with a first NMR logging acquisition mode and the NMR logging acquisition mode of the NMR logging tool is set to a second NMR logging acquisition mode based on the scout logging acquisition operation.

Embodiment 8: The method of any preceding embodiment, wherein setting the NMR logging acquisition mode comprises using a look-up table based on the NMR logging parameters of the formation interval.

Embodiment 9: The method of any preceding embodiment, wherein the scout logging acquisition operation is performed based on a trigger.

Embodiment 10: The method of any preceding embodiment, wherein the trigger comprises at least one of a time interval, a depth interval, a detected changed in a formation interval, and a signal received at the NMR logging tool from the surface.

Embodiment 11: The method of any preceding embodiment, wherein the trigger is received from a different downhole tool operably connected to the NMR logging tool.

Embodiment 12: A downhole logging system comprising: an NMR logging tool configured to: perform a scout logging acquisition operation using an NMR logging tool to determine NMR logging parameters of a formation interval; set an NMR logging acquisition mode based on the NMR logging parameters from the scout logging acquisition operation; and perform an NMR data logging operation to determine properties of the formation interval based on the set NMR logging acquisition mode.

Embodiment 13: The downhole logging system of any preceding embodiment, further comprising: a tool string, wherein the NMR logging tool is disposed along the tool string.

Embodiment 14: The downhole logging system of any preceding embodiment, wherein the tool string is a drill string.

Embodiment 15: The downhole logging system of any preceding embodiment, wherein the scout logging acquisition operation is performed while drilling.

Embodiment 16: The downhole logging system of any preceding embodiment, wherein the NMR logging tool is disposed along a wireline tool string.

Embodiment 17: The downhole logging system of any preceding embodiment, wherein the NMR logging tool is set with a first NMR logging acquisition mode and the NMR logging acquisition mode of the NMR logging tool is set to a second NMR logging acquisition mode based on the scout logging acquisition operation.

Embodiment 18: The downhole logging system of any preceding embodiment, wherein the NMR logging tool includes a memory having a look-up table stored thereon, wherein the setting of the NMR logging acquisition mode comprises using the look-up table based on the NMR logging parameters of the formation interval.

Embodiment 19: The downhole logging system of any preceding embodiment, wherein the scout logging acquisition operation is performed based on a trigger.

Embodiment 20: The downhole logging system of any preceding embodiment, wherein the trigger comprises at least one of a time interval, a depth interval, a detected changed in a formation interval, and a signal received at the NMR logging tool from the surface.

In support of the teachings herein, various analysis components may be used including a digital and/or an analog system. For example, controllers, computer processing systems, and/or geo-steering systems as provided herein and/or used with embodiments described herein may include digital and/or analog systems. The systems may have components such as processors, storage media, memory, inputs, outputs, communications links (e.g., wired, wireless, optical, or other), user interfaces, software programs, signal processors (e.g., digital or analog) and other such components (e.g., such as resistors, capacitors, inductors, and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (e.g., ROMs, RAMs), optical (e.g., CD-ROMs), or magnetic (e.g., disks, hard drives), or any other type that when executed causes a computer to implement the methods and/or processes described herein. These instructions may provide for equipment operation, control, data collection, analysis and other functions deemed relevant by a system designer, owner, user, or other such personnel, in addition to the functions described in this disclosure. Processed data, such as a result of an implemented method, may be transmitted as a signal via a processor output interface to a signal receiving device. The signal receiving device may be a display monitor or printer for presenting the result to a user. Alternatively, or in addition, the signal receiving device may be memory or a storage medium. It will be appreciated that storing the result in memory or the storage medium may transform the memory or storage medium into a new state (i.e., containing the result) from a prior state (i.e., not containing the result). Further, in some embodiments, an alert signal may be transmitted from the processor to a user interface if the result exceeds a threshold value.

Furthermore, various other components may be included and called upon for providing for aspects of the teachings herein. For example, a sensor, transmitter, receiver, transceiver, antenna, controller, optical unit, electrical unit, and/or electromechanical unit may be included in support of the various aspects discussed herein or in support of other functions beyond this disclosure.

The use of the terms "a" and "an" and "the" and similar referents in the context of describing the invention (especially in the context of the following claims) are to be construed to cover both the singular and the plural, unless otherwise indicated herein or clearly contradicted by context. Further, it should be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the present disclosure.

The teachings of the present disclosure may be used in a variety of well operations. These operations may involve using one or more treatment agents to treat a formation, the fluids resident in a formation, a borehole, and/or equipment in the borehole, such as production tubing. The treatment agents may be in the form of liquids, gases, solids, semisolids, and mixtures thereof. Illustrative treatment agents include, but are not limited to, fracturing fluids, acids, steam, water, brine, anti-corrosion agents, cement, permeability modifiers, drilling muds, emulsifiers, demulsifiers, tracers, flow improvers etc. Illustrative well operations include, but are not limited to, hydraulic fracturing, stimulation, tracer injection, cleaning, acidizing, steam injection, water flooding, cementing, etc.

While embodiments described herein have been described with reference to various embodiments, it will be understood that various changes may be made and equivalents may be substituted for elements thereof without departing from the scope of the present disclosure. In addition, many modifications will be appreciated to adapt a particular instrument, situation, or material to the teachings of the present disclosure without departing from the scope thereof. Therefore, it is intended that the disclosure not be limited to the particular embodiments disclosed as the best mode contemplated for carrying the described features, but that the present disclosure will include all embodiments falling within the scope of the appended claims.

Accordingly, embodiments of the present disclosure are not to be seen as limited by the foregoing description, but are only limited by the scope of the appended claims.

What is claimed:

1. A method for performing nuclear magnetic resonance (NMR) logging in downhole operations, the method comprising:
    performing a scout logging acquisition operation using an NMR logging tool to determine NMR logging parameters for a formation interval;
    setting an NMR logging acquisition mode based on the NMR logging parameters from the scout logging acquisition operation; and
    performing an NMR data logging operation to determine properties of the formation interval based on the set NMR logging acquisition mode,
    wherein the scout logging acquisition operation comprises an NMR pulse sequence different from an NMR pulse sequence of the NMR data logging operation.

2. The method of claim 1, wherein the NMR pulse sequence of the scout logging acquisition operation has a longer acquisition length than the NMR pulse sequence of the NMR data logging operation.

3. The method of claim 1, wherein the NMR logging tool is disposed along a drill string.

4. The method of claim 3, wherein the scout logging acquisition operation is performed while drilling.

5. The method of claim 1, wherein the NMR logging tool is disposed along a wireline tool string.

6. The method of claim 1, wherein the NMR logging tool is set with a first NMR logging acquisition mode and the NMR logging acquisition mode of the NMR logging tool is set to a second NMR logging acquisition mode based on the scout logging acquisition operation.

7. The method of claim 1, wherein setting the NMR logging acquisition mode comprises using a look-up table based on the NMR logging parameters for the formation interval.

8. The method of claim 1, wherein the scout logging acquisition operation is performed based on a trigger.

9. The method of claim 8, wherein the trigger comprises at least one of a time interval, a depth interval, a detected changed in a formation interval, and a signal received at the NMR logging tool from the surface.

10. The method of claim 8, wherein the trigger is received from a different downhole tool operably connected to the NMR logging tool.

11. A downhole logging system comprising:
    an NMR logging tool configured to:
    perform a scout logging acquisition operation using an NMR logging tool to determine NMR logging parameters for a formation interval;
    set an NMR logging acquisition mode based on the NMR logging parameters from the scout logging acquisition operation; and
    perform an NMR data logging operation to determine properties of the formation interval based on the set NMR logging acquisition mode,
    wherein the scout logging acquisition operation comprises an NMR pulse sequence different from an NMR pulse sequence of the NMR data logging operation.

12. The downhole logging system of claim 11, further comprising:
    a tool string, wherein the NMR logging tool is disposed along the tool string.

13. The downhole logging system of claim 12, wherein the tool string is a drill string.

14. The downhole logging system of claim 13, wherein the scout logging acquisition operation is performed while drilling.

15. The downhole logging system of claim 11, wherein the NMR logging tool is disposed along a wireline tool string.

16. The downhole logging system of claim 11, wherein the NMR logging tool is set with a first NMR logging acquisition mode and the NMR logging acquisition mode of the NMR logging tool is set to a second NMR logging acquisition mode based on the scout logging acquisition operation.

17. The downhole logging system of claim 11, wherein the NMR logging tool includes a memory having a look-up table stored thereon, wherein the setting of the NMR logging acquisition mode comprises using the look-up table based on the NMR logging parameters for the formation interval.

18. The downhole logging system of claim 11, wherein the scout logging acquisition operation is performed based on a trigger.

19. The downhole logging system of claim 18, wherein the trigger comprises at least one of a time interval, a depth interval, a detected changed in a formation interval, and a signal received at the NMR logging tool from the surface.

20. The downhole logging system of claim 11, wherein the NMR pulse sequence of the scout logging acquisition operation has a longer acquisition length than the NMR pulse sequence of the NMR data logging operation.

* * * * *